(12) United States Patent
Shaver

(10) Patent No.: US 6,965,484 B2
(45) Date of Patent: Nov. 15, 2005

(54) OPTICAL IMAGING SYSTEMS AND METHODS USING POLARIZED ILLUMINATION AND COORDINATED PUPIL FILTER

(75) Inventor: David C. Shaver, Carlisle, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 50 days.

(21) Appl. No.: 10/626,440

(22) Filed: Jul. 24, 2003

(65) Prior Publication Data

US 2004/0245439 A1 Dec. 9, 2004

Related U.S. Application Data

(60) Provisional application No. 60/398,659, filed on Jul. 26, 2002.

(51) Int. Cl.[7] ............................. G02B 9/00; G02B 9/08; G03B 27/72
(52) U.S. Cl. .......................................... 359/738; 355/71
(58) Field of Search ................. 359/562, 563, 359/738, 739, 740; 355/57, 71, 77; 430/5, 22, 756

(56) References Cited

U.S. PATENT DOCUMENTS 5,442,184 A  8/1995  Palmer et al.
5,541,026 A  7/1996  Matsumoto
5,673,103 A  9/1997  Inoue et al.
5,739,898 A  4/1998  Ozawa et al.
5,933,219 A  8/1999  Unno

FOREIGN PATENT DOCUMENTS

JP  07 142338  6/1995

*Primary Examiner*—Georgia Epps
*Assistant Examiner*—Alicia M Harrington
(74) *Attorney, Agent, or Firm*—Wolf, Greenfield & Sacks, P.C.

(57) ABSTRACT

Optical imaging systems and methods use polarized illumination and a coordinated pupil filter to achieve high contrast. An imaging system includes a light source to generate light for illuminating an object having features aligned in a first direction and features aligned in a second direction, a lens for imaging the illuminated object onto a surface, a spatial selection device, such as a pupil filter, selective in a first mode of light corresponding to features of the illuminated object aligned in the first direction and selective in a second mode of light corresponding to features of the illuminated object aligned in a second direction, a polarization device optically coupled to the spatial selection device and selective in the first mode of s-polarized light corresponding to the first direction and selective in the second mode of s-polarized light corresponding to the second direction, and a controller for selecting operation in the first mode or in the second mode.

20 Claims, 6 Drawing Sheets

OPTICAL IMAGING SYSTEMS AND METHODS USING POLARIZED ILLUMINATION AND COORDINATED PUPIL FILTER

CROSS REFERENCE TO RELATED APPLICATION

This application claims the benefit of provisional application Ser. No. 60/398,659, filed Jul. 26, 2002, which is hereby incorporated by reference.

STATEMENT OF GOVERNMENT SPONSORED R&D

This invention was made with government support under contract no. F 19628-00C-0002. The Government may have certain rights in the invention.

FIELD OF THE INVENTION

This invention relates to optical imaging systems and methods and, more particularly, to optical lithography systems and methods.

BACKGROUND OF THE INVENTION

As optical lithography systems are designed to print smaller feature sizes, their operational wavelengths are being reduced, and their numerical apertures (NAs) are being increased. Current conventional lithographic production utilizes 248-nm (nanometer) wavelengths, and numerical apertures from 0.6 to as high as about 0.75. Small-field exposure systems in development use NAs as high as 0.9.

FIG. 1 is a schematic illustrating parameters used to specify NA. Lens system 100 is illustrated as a single lens element. However, NA can be specified for an arbitrarily complicated lens system. For example, system 100 may be a lithographic projection system.

NA is defined by the equation:

$$NA = n \sin(\theta);$$

where θ is the semi-angle (measured from optical axis 120) of a cone of rays 130 forming an image on a surface 150; and n is the index of refraction of region 110 on the image side of system 100 (i.e., the side of system 100 on which the semi-angle θ is measured). For a typical lens system, region 110 is filled with air or nitrogen, both having indices of refraction that are substantially equal to 1.

In the case of lithographic systems, the image formed by lens system 100 is typically projected into a thin layer of photosensitive resist 152 (also referred to as a photoresist), which is subsequently processed to make a circuit design of a semiconductor device. As rays 130 enter resist 152, they are refracted. At wavelengths of 193-nm and 157-nm, the index of refraction $n_r$ of photoresist 152 is typically approximately 1.5, and at longer wavelengths, such as the 365-nm commonly used for semiconductor lithography, the index of refraction $n_r$ of photoresist 152 is often as high as about 1.8.

According to Snell's Law, upon transmission from a lower index material (e.g., air) into a higher index material (e.g., photoresist 152), the incident rays are brought closer to the optical axis (i.e., $\theta_r$ is smaller than θ). For a ray at the limit of the lens NA, the angle of the ray in the resist is given by the following equation:

$$\sin(\theta_r) = \sin(\theta)/n_r = NA/n_r;$$

where $\theta_r$ = the angle (from the surface normal) of the ray in the resist; and θ = the angle of the ray, in the medium above the resist 152 (e.g., air).

The above equation illustrates that for lens systems having small NAs, and a high-index resist 152, rays are relatively close to optical axis 120. Accordingly, for such systems it has generally been assumed that rays are sufficiently close to optical axis 120 that one can neglect the vector nature of the incident light. However, as NAs are increased and $n_r$ is decreased, ray angles depart substantially from normal incidence, and the vector nature of light affects the image contrast. The nature of the reduction in contrast is described in greater detail below.

FIG. 2 is a schematic diagram of a simple, but representative, conventional lithographic system 200. Imaging system 200 includes, for example, a so-called chromeless phase-shifting mask 210, having a phase-shift grating structure 212 (i.e., an array of closely spaced etched features having a height which delays light passing through the thicker regions by one-half of the operational wavelength relative to the light passing through the thinner regions). In system 200, light 222 from an illumination source 220 is used to expose grating structure 212, and grating structure 212 is imaged onto a surface 250 by lens system 202.

When grating structure 212 is illuminated with spatially coherent light at near-normal incidence to mask 210, the phase shift grating structure 212 on mask 210 results in two diffracted beams 230a and 230b. FIG. 2 is illustrated using a coordinate system where grating structure 212 is aligned in an X-Y plane, an optical axis 240 is aligned with the Z-axis, and grating elements in grating structure 212 are aligned with the X-axis. Accordingly, diffracted beams 230a, 230b lie in a Y-Z plane of incidence. While not shown in FIG. 2, is should be appreciated that a grating structure having grating elements aligned parallel to the Y-axis and illuminated with light 222 would produce diffracted beams lying in a X-Z plane of incidence.

A "plane of incidence" of a ray is defined as the plane containing the ray, and the normal vector (e.g., optical axis 240) of the incident surface (e.g., surface 250). For the simple case of a mask having all grating elements aligned in the direction of one axis, as illustrated in FIG. 2, all rays (e.g., 230a and 230b) lie in the same plane of incidence. However, rays emanating from a mask having a more complex pattern (i.e., a mask having features aligned in multiple directions) arrive at surface 250 in multiple planes of incidence.

As one of ordinary skill would understand, as the density of the grating elements of the grating structure 212 increases (i.e., the grating pitch of grating structure 212 decreases), the angles $\theta_r$ that diffracted beams 230a and 230b make with optical axis 240 increase. In FIG. 2, grating structure 212 is illustrated having a pitch that causes diffracted beams 230a and 230b to emerge at angles $\theta_r$ just within the NA of the imaging system. Such a grating structure pushes optical system 200 to near its theoretically limiting performance.

When the beams 230a and 230b depart substantially from normal incidence with surface 250 (i.e., NA is relatively large), the vector nature of the incident light affects the image contrast at surface 250. Specifically, it has been observed that as the NA is increased, the portion of light incident on surface 250 that is s-polarized (i.e., the portion of the light having an electric field vector $E_s$ perpendicular to the plane of incidence) interferes to form a grating image of high contrast for all angles of incidence θ, while light that is p-polarized (i.e., the portion of the light having an electric field vector $E_p$ parallel to the plane of incidence) has reduced (or even no) image contrast. The degree of reduction in contrast is a function of the angle of incidence θ.

One of ordinary skill will understand that components of light in a beam of light (e.g., beam 230a or 230b) are determined to be s-polarized or p-polarized based, in part, on the light's direction of impingement on surface 250. Because the direction of a ray is determined by the angle of diffraction caused by mask 210, a ray impinging on mask 210 may become an s-polarized or p-polarized ray depending on whether the feature diffracting the ray is aligned with the x-axis or the y-axis.

In general, the interference of the electric fields from the respective s-polarized and p-polarized beams 230a and 230b gives rise to the image pattern at surface 250, and determines the contrast of the image at surface 250. For s-polarized light, the electric field vectors $E_s$ of beams 230a and 230b are parallel, since they are both normal to the plane of incidence (perpendicular to the plane of FIG. 2), thus ensuring that there are electric field vector components to interfere. By contrast, for p-polarized light, when beams 230a and 230b arrive at near normal incidence to surface 250, (e.g., due to low NA or high index resist) the electric field vectors $E_p$ of beams 230a and 230b are nearly parallel, and interfere effectively. However, in a case in which beams 230a and 230b are at a 90-degree angle to each other, as measured in the plane of incidence (i.e., each of the beams 230a and 230b impinges on surface 250 at 45 degrees relative to the optical axis 240), the electric field vectors $E_p$ are normal to one another, and therefore there are no common electric field vector components to interfere. Thus, there is essentially no image contrast in a two-beam exposure for the p-polarization when the rays 230a and 230b arrive at 90 degrees to each other.

In view of the foregoing, it may be appreciated that for the extreme case of two rays at 90 degrees to each other, one would have virtually 100% image contrast for the s-polarization and 0% image contrast for the p-polarization. If one used unpolarized incident light (i.e., light having a randomly varying polarization over an exposure duration) incident light on the mask, one would obtain a contrast of only 50%.

One prior art solution to the problem of reduced contrast in a lithographic system involves dividing mask data (i.e., the grating pattern of mask 210 of FIG. 2) into two masks, each mask having features oriented substantially along a single axis (i.e., the X-axis, or the Y-axis). In such a system, each mask is exposed using light having a single polarization; to achieve improved contrast, the polarization is selected such that only s-polarized light is used to form the resulting image during each exposure. Drawbacks of such a system include the expense of producing two masks to produce a single image, and the presence of overlay errors that result in reductions in image quality. The overlay errors arise from the need to align the outputs formed by the two exposures necessary to obtain a single image containing information from both masks.

SUMMARY OF THE INVENTION

Aspects of the present invention apply a recognition that the proper use of p-polarized and s-polarized portions of illumination is important for generating high contrast images using high NA exposure systems. In particular, one aspect of the present invention is based on an appreciation that zero contrast is obtained for the p-polarized light when the angle of incidence is 45 degrees, and reduced contrast is obtained for other angles (particularly those having angles near 45-degree angles of incidence), as discussed above. Further aspects of the invention also address the complication caused by the fact that complex masks produce rays with differing angles of incidence on a photosensitive surface, such that it is difficult to select a single polarization which is simultaneously optimum for all feature orientations on the mask.

According to a first aspect of the invention, an imaging system is provided. The imaging system comprises a light source to generate light for illuminating an object having features aligned in a first direction and features aligned in a second direction, a lens for imaging the illuminated object onto a surface, a spatial selection device selective in a first mode of light corresponding to features of the illuminated object aligned in the first direction and selective in a second mode of light corresponding to features of the illuminated object aligned in the second direction, a polarization device optically coupled to a spatial selection device and selective in the first mode of s-polarized light corresponding to the first direction and selective in the second mode of s-polarized light corresponding to the second direction, and a controller for selecting operation in the first mode or in the second mode.

According to a second aspect of the invention, a method is provided for projecting an image onto a surface. The method comprises generating light for illuminating an object having features aligned in a first direction and features aligned in a second direction, in a first step, imaging onto the surface light corresponding to features of the illuminated object aligned in the first direction, blocking light corresponding to features of the illuminated object aligned in the second direction and polarizing light imaged onto the surface to select s-polarized light corresponding to the first direction, and, in a second step, imaging onto the surface light corresponding to features of the illuminated objected aligned in the second direction, blocking light corresponding to features of the illuminated object aligned in a first direction and polarizing light imaged onto surface to select s-polarized light corresponding to the second direction.

According to a third aspect of the invention, an imaging method comprises generating light for illuminating an object having features aligned in a first direction and features aligned in a second direction, imaging the illuminated object onto a surface, in a first step, selecting light corresponding to features of the illuminated object aligned in a first direction and selecting s-polarized light corresponding to the first direction, and, in a second step, selecting light corresponding to features of the illuminated object aligned in the second direction and selecting s-polarized light corresponding to the second direction.

According to a fourth aspect of the invention, an optical lithographic system is provided for projecting onto a surface a mask having features aligned in a first direction and features aligned in a second direction. The imaging system comprises a pupil filter selective in a first position of light corresponding to features of the illuminated mask aligned in the first direction and selective in a second position of light corresponding to features of the illuminated mask aligned in the second direction, a polarizer optically coupled to the pupil filter and selective in the first position of s-polarized light corresponding to the first direction and selective in the second position of s-polarized light corresponding to the second direction, and a device configured for movement of the pupil filter and the polarizer between the respective first and second positions thereof.

According to a fifth aspect of the invention, an imaging system is provided for imaging an object onto a surface, wherein the object has features aligned in a first direction and features aligned in a second direction. The imaging system comprises a lens system, and a pupil filter located proximate a pupil of the lens system. The pupil filter has a first position selective of light corresponding to the features aligned in the first direction, and a second position selective of light corresponding to features aligned in the second direction. The imaging system also includes a polarizer optically coupled to the pupil filter, the polarizer having a first polarizer position selective of s-polarized light corresponding to the first direction, and a second polarizer position selective of s-polarized light corresponding to the second direction. The pupil filter is coordinated with the polarizer to be in the first polarizer position when the pupil filter is in the first position, and in the second polarizer position when the pupil filter is in the second position.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
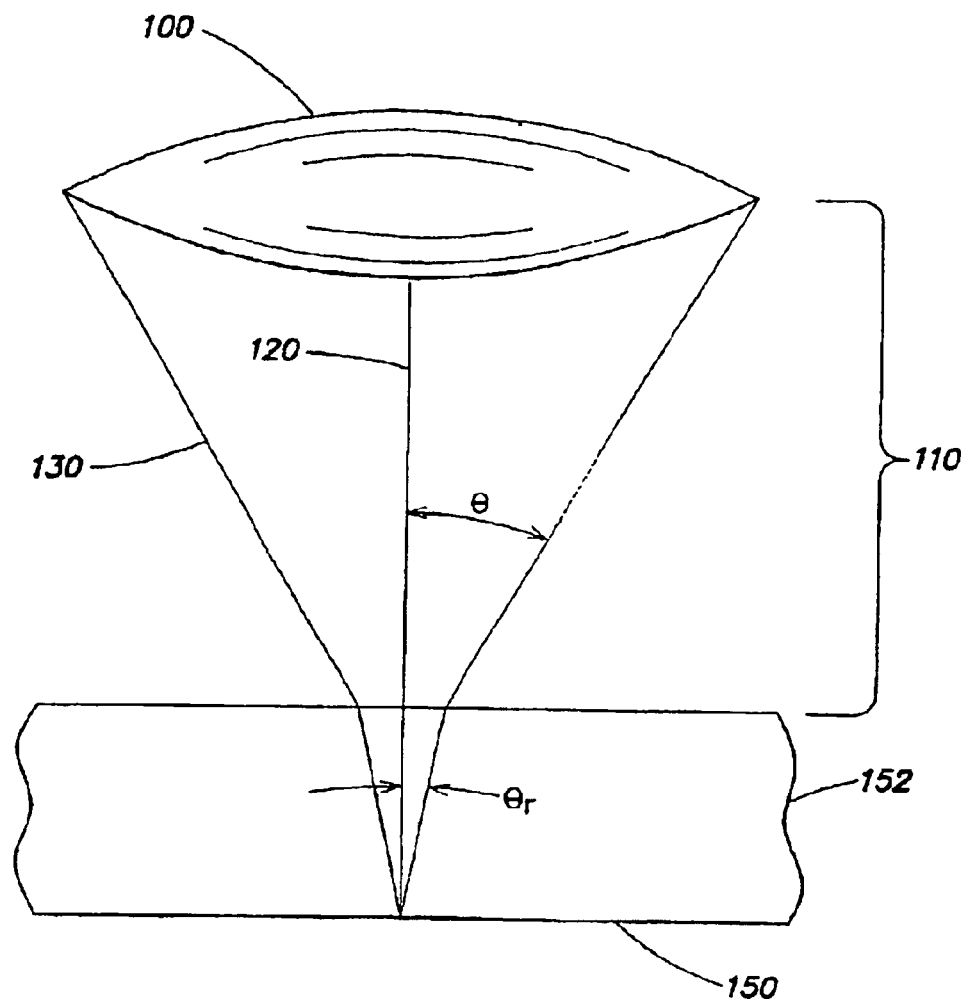
FIG. 1 is a schematic diagram that illustrates parameters used to specify numerical aperture.
Figure 2:
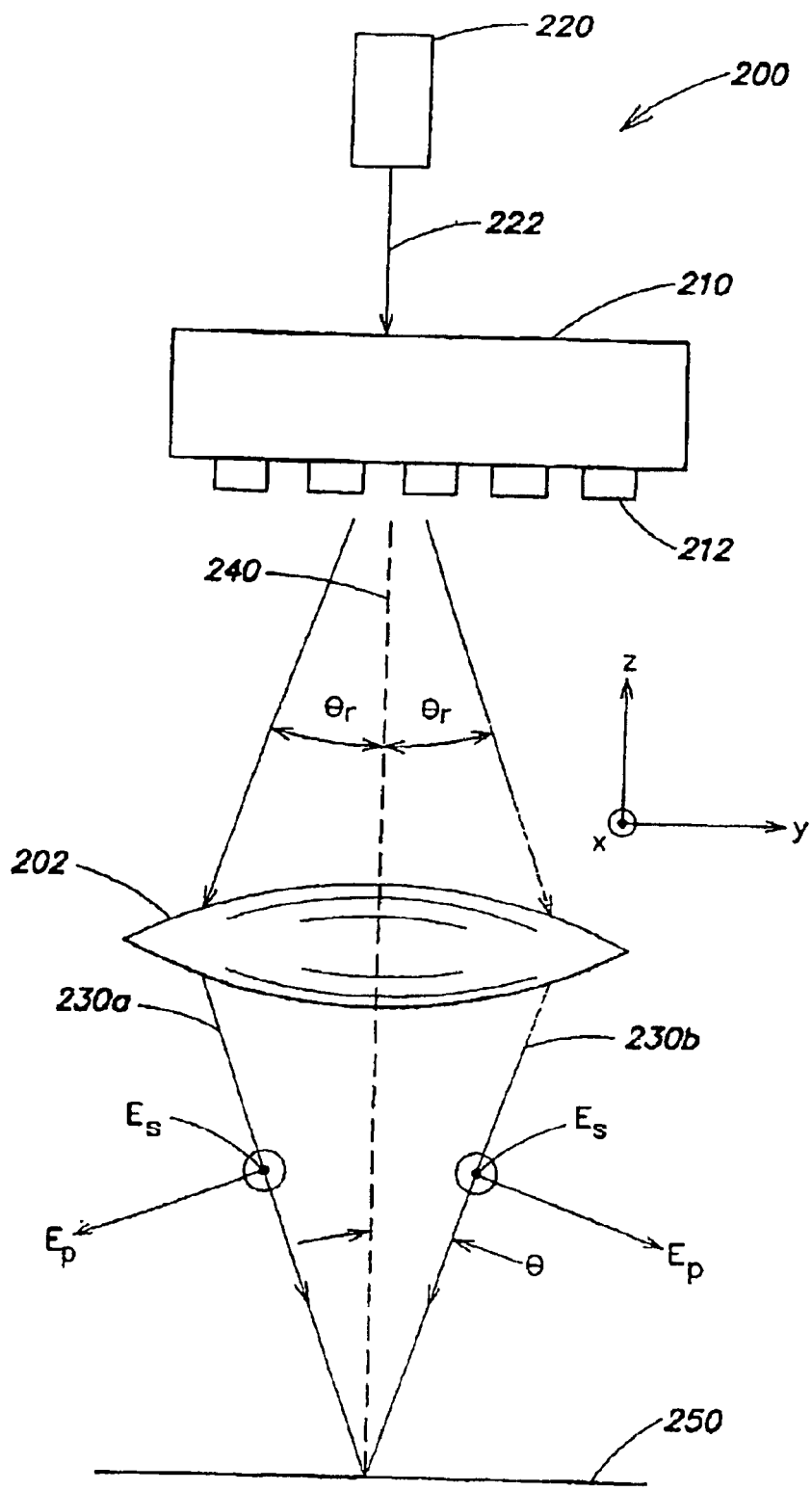
FIG. 2 is a schematic block diagram of a conventional lithographic system.
Figure 3:
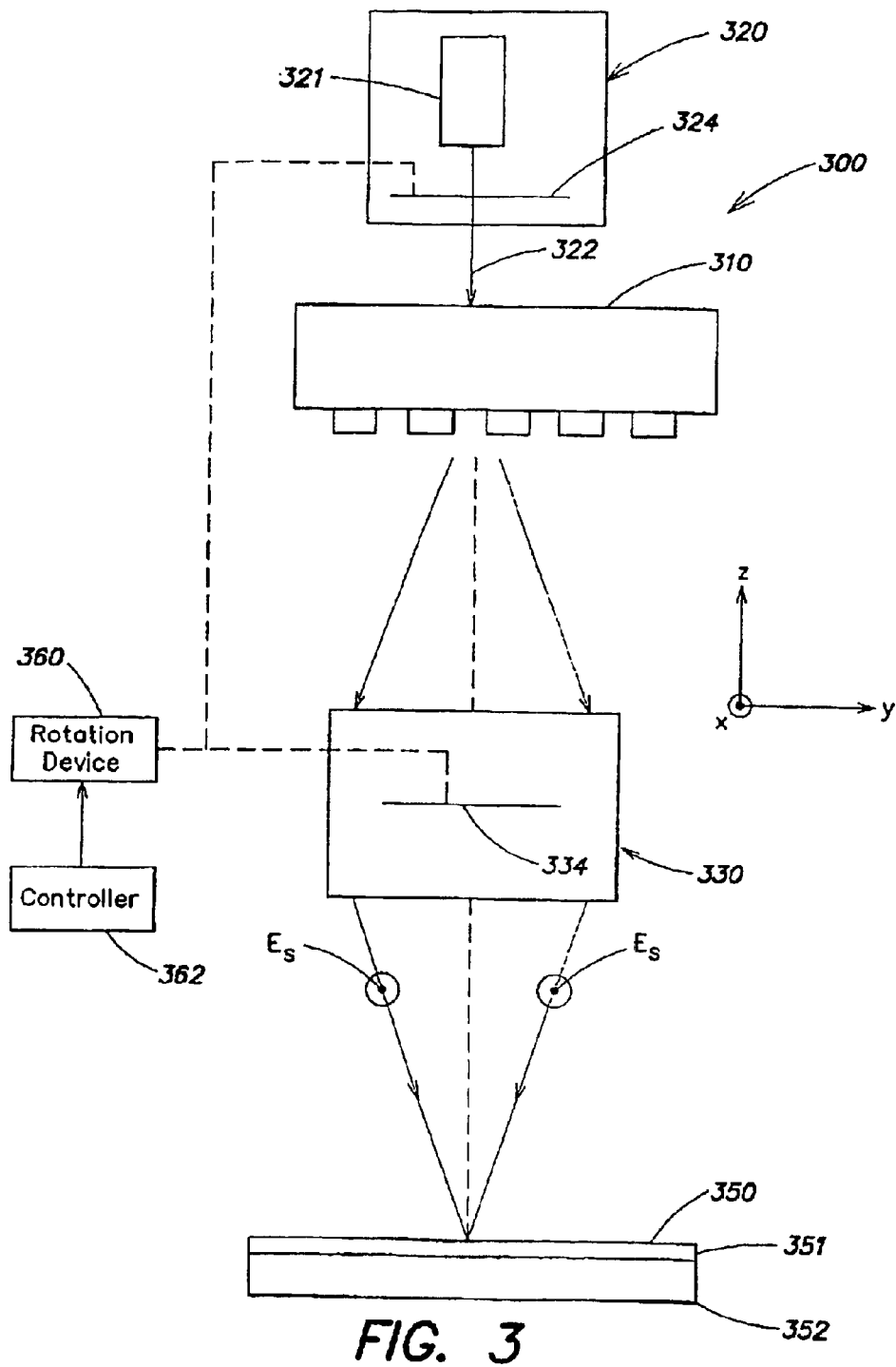
FIG. 3 is a schematic block diagram of an imaging system in accordance with an embodiment of the invention.

FIG. 3 is a schematic diagram of an imaging system 300 in accordance with an embodiment of the present invention. In system 300, a mask 310 having a complex pattern is imaged onto an image plane, such as a photosensitive layer 350, by a lens system 330. Photosensitive layer 350 may be formed on a substrate 351, such as a semiconductor wafer, for example. Optionally, substrate 351 may be mounted on a translation stage 352. Imaging system 300 can be a lithographic system or any other known imaging system. Accordingly, mask 310 can be any photolithographic mask or any object-to-be-imaged. Photosensitive layer 350 can be any known photosensitive layer, e.g., a photographic film or a photoresist.

A light source module 320 illuminates mask 310 with a light beam 322. Light source module 320 includes a light source 321 (e.g., a lamp or a laser). In this embodiment, light source 321 produces circularly polarized or unpolarized light. In another embodiment, light source module 320 includes an excimer laser. In some embodiments, light source module 320 includes a polarizer 324 to polarize beam 322. The polarizer device may be of any of several types, such as a linear polarizer to convert unpolarized or circularly polarized light into linearly polarized light with the desired polarization orientation. In some embodiments, polarizer 324 linearly polarizes beam 322. While in the illustrated system 300, polarizer 324 is located between light source 321 and mask 310, polarizer 324 can be located between mask 310 and lens system 330, or after lens system 330, or at any location before photosensitive layer 350.

Lens system 330 may be any suitable refractive, reflective or diffractive imaging system capable of imaging mask 310 on layer 350. Lens system 330 may include a variable pupil filter 334 located proximate a pupil of lens system 330. For the purposes of this disclosure, the term "pupil" shall mean the aperture stop or any conjugate of the aperture stop of the lens system, where "aperture stop" means the physical feature determining the numerical aperture of the system. The phrase "proximate the pupil" shall mean locations substantially nearer the pupil than any conjugate of mask 310.

Pupil filter 334 may have at least two positions. In a first pupil filter position, pupil filter 334 transmits light diffracted from mask features substantially aligned in a first direction and blocks light diffracted from mask features substantially aligned in a second direction. That is, in the first position, pupil filter 334 is selective of light in the first direction. In a second pupil filter position, pupil filter 334 transmits light diffracted from mask features substantially aligned in the second direction and blocks light diffracted from mask features substantially aligned in the first direction. That is, in the second position, the pupil filter 334 is selective of light in the second direction. The first direction may be perpendicular to the second direction. For example, the first direction may be the x-direction and the second direction may be the y-direction.

Polarizer 324 polarizes light, and is coordinated with pupil filter 334 to be in a first polarizer position when pupil filter 334 is in the first pupil filter position, and to be in a second polarizer position when the pupil filter 334 is in the second pupil filter position. For example, in the first polarizer position, the polarizer may transmit s-polarized light corresponding to mask features substantially aligned in the first direction, and block p-polarized light corresponding to mask features substantially aligned in the first direction. In the second polarizer position, the polarizer may transmit s-polarized light corresponding to mask features substantially aligned in the second direction, and block p-polarized light corresponding to mask features substantially aligned in the second direction.

Imaging system 300 may include a rotation device 360 operatively coupled to polarizer 324 and to pupil filter 334, as indicated by dashed lines in FIG. 3. Rotation device 360 may include a motor or an actuator, for example. Rotation device 360 rotates polarizer 324 between first and second polarizer positions and rotates pupil filter 334 between first and second pupil filter positions in a coordinated manner, as described above. Thus, polarizer 324 and pupil filter 334 are in respective first positions in a first step or mode, and are in respective second positions in a second step or mode. A controller 362 controls rotation device 360 to establish operation in the first step or mode, or in the second step or mode. In some embodiments, polarizer 324 and pupil filter 334 are rotated by 90° between the first and second positions. However, polarizer 324 and pupil filter 334 may be rotated through the same angle or through different angles to achieve the desired operation, depending on the configurations of the individual elements.

One of ordinary skill will understand that, although rotation of polarizer 324 and pupil filter 334 may be the most convenient technique for achieving the two positions, any suitable method of achieving a given orientation of polarization of beam 322 and pupil filter 334 relative to photosensitive layer 350 is within the scope of the present invention. Rather than a single pupil filter having two or more different positions, two or more different pupil filters may be utilized. The appropriate pupil filter is moved into the optical path of the imaging system in the corresponding step or mode. Orientations of polarizer 324 and pupil filter 334 can be achieved using any known positioning mechanism. For example, an orientation can be achieved by manual movement by a human operator or by an automated mechanical device.

Figure 4A:
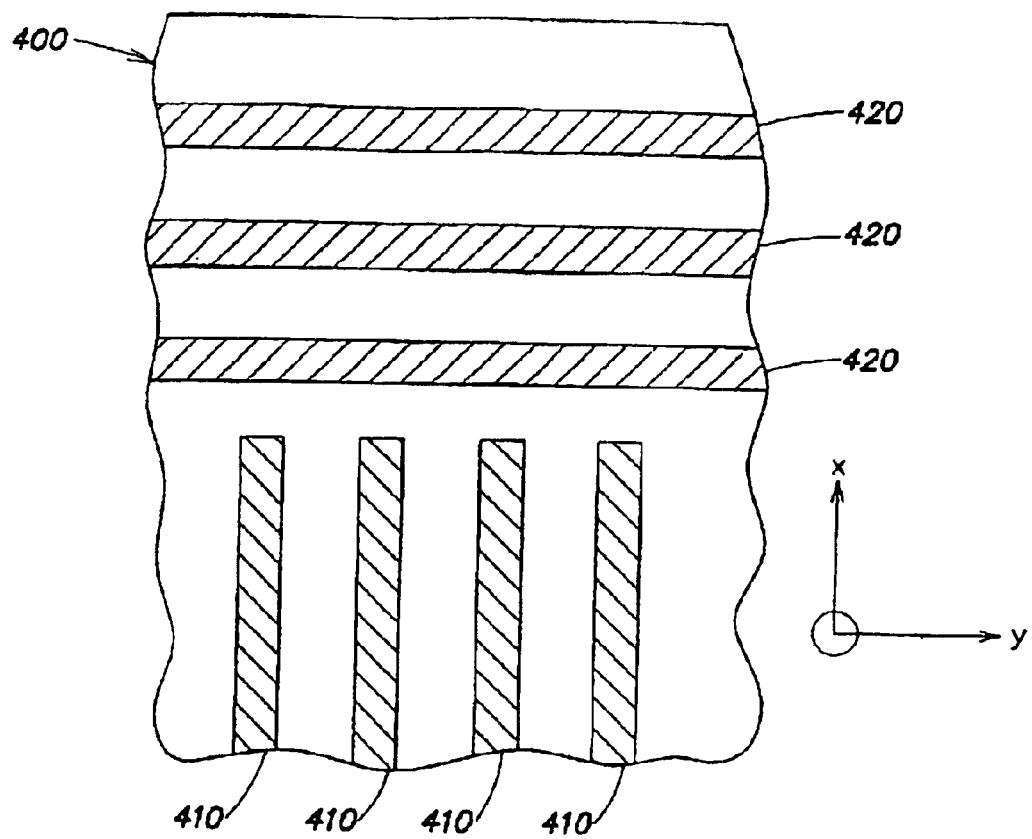
FIG. 4a is a top view of an example of a complex grating.

FIG. 4a is a top view of one example a relatively uncomplicated complex grating 400 useful for illustrating aspects of the present invention. Complex grating 400 has features aligned in two directions. Features 410 are aligned in the x-direction, and features 420 are aligned in the y-direction. One of ordinary skill will understand that even the most complex mask is composed of spatial frequency components aligned in the x-direction and the y-direction. Accordingly, although the principles of the present invention are described using uncomplicated complex objects, the principles described below can be applied to more complex objects.

Figure 4B:
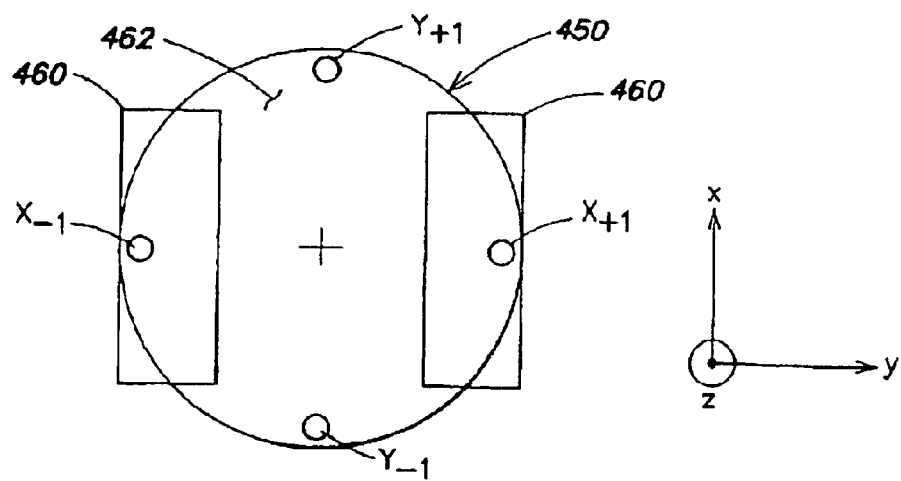
FIG. 4b is a top view of an embodiment of a pupil filter that may be used in the imaging system of FIG. 3.

FIG. 4b is a top view of one embodiment of a pupil filter 450 that may be used as pupil filter 334 in the imaging system 300 of FIG. 3. Pupil filter 450 is a spatial selection device which includes one or more blocking regions 460 and one or more non-blocking regions 462. By way of example, blocking regions 460 may have 0% or nearly 0% light transmission, and non-blocking regions 462 may have 100% or nearly 100% light transmission. In some embodiments, the pupil filter may include one or more partially transmissive regions having light transmission between 0% and 100%. The blocking region regions and the non-blocking regions may have any desired size and shape that is compatible with the optical system and with the desired operation. In FIG. 4b, blocking regions 460 are rectangular. Other embodiments of the pupil filter are described below. In FIG. 4b, bundles of rays $X_{+1}$, $X_{-1}$, $Y_{+1}$, and $Y_{-1}$ (i.e., beams) corresponding to diffractive orders of the complex grating on mask 310 are shown so as to illustrate aspects of the present invention. Further aspects of the present invention are discussed with reference to FIG. 3 in conjunction with FIGS. 4a and 4b.

Referring to FIG. 4b, bundles of rays $X_{+1}$ and $X_{-1}$ correspond to the +1 and −1 diffracted orders of mask features 410 (e.g., grating lines) aligned in the X-direction. The location of bundles of rays $X_{+1}$, and $X_{-1}$ near the outer edge of pupil filter corresponds to a pitch (or spatial frequency) nearing the performance limit of the optical system. Bundles of rays $Y_{+1}$ and $Y_{-1}$ correspond to the +1 and −1 diffracted orders of mask features 420 (e.g., grating lines) aligned in the Y-direction. The location of bundles of rays $Y_{+1}$, and $Y_{-1}$, near the outer edge of pupil filter also corresponds to a pitch (or spatial frequency) nearing the performance limit of the optical system. Pupil filter 450 has two rotational positions, each position selective of light corresponding to mask features aligned in a given direction (e.g., the x-direction or the y-direction).

Referring again to FIG. 3, polarizer 324 is coordinated with pupil filter 334 to polarize light 322 so that in a first position, pupil filter 334 is selective of features aligned in a first direction. Polarizer 324 is coordinated to be in a first polarizer position selective of s-polarized light corresponding to mask features aligned in the first direction, and in a second position, pupil filter 334 is selective of features aligned in a second direction, and polarizer 324 is coordinated to be in a second polarizer position selective of s-polarized light corresponding to mask features aligned in the second direction.

According to aspects of the present invention, an image having increased resolution can be projected on photosensitive layer 350 using a two-step process. In a first step, light from source module 320 is selected such that light incident on the mask 310 is polarized substantially in the x-direction (i.e., the E-field is aligned in the x-direction). For the x-oriented features of mask 310 (e.g., features 410 of mask 400 in FIG. 4a) that are illuminated with light polarized substantially in the x-direction, the interefering diffraction orders are s-polarized, and for the y-oriented features of a mask the interefering diffraction orders are p-polarized.

As described above, s-polarized light forms high contrast image and p-polarized light forms a low contrast image. Accordingly, to achieve a high contrast image it is desirable to block the p-polarized light. Pupil filter 334 is positioned to block diffracted orders corresponding to y-oriented features (i.e., by blocking portions of the light through the pupil filter substantially aligned along the X-axis). In this manner only the x-oriented features are printed, and they are printed with high contrast.

In a second step, light from source 320 is selected such that light incident on the mask is polarized substantially in the y-direction (i.e., the E-field is aligned in the y-direction). For the y-oriented features of mask 310 (e.g., features 420 of mask 400 in FIG. 4a) that are illuminated with light polarized substantially in the y-direction, the interfering diffraction orders are s-polarized, and for the x-oriented features of mask 310, the interfering diffraction orders are p-polarized.

Pupil filter 334 is positioned to block diffracted orders corresponding to x-oriented features (i.e., by blocking portions of the light through the pupil filter substantially aligned along the Y-axis). In this manner, only the y-oriented features are printed, and they are printed with high contrast. Thus, in this two step exposure, all x-aligned and y-aligned mask features are printed with the optimum s-polarized light.

Preferably, the intensity of the light projected onto layer 350 during step one is equal or nearly equal to the intensity of the light projected onto layer 350 during step two. Although the above is described with two rotational positions having 90-degree separation, embodiments having positions separated by any finite angular separation are included within the scope of the present invention.

Figure 5A:
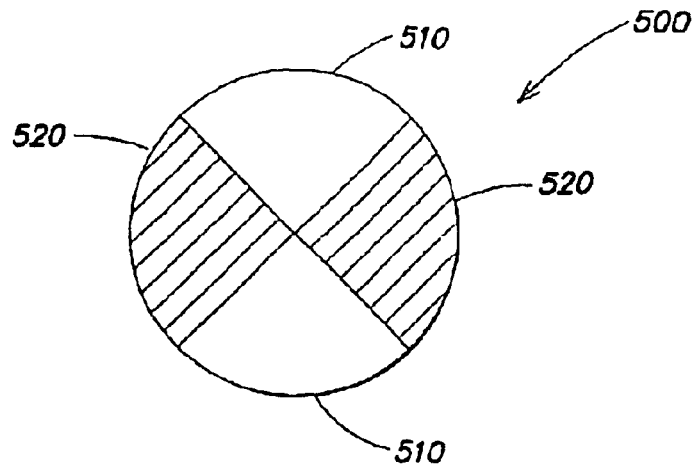
FIG. 5a is a top view of an embodiment of a pupil filter having wedge shaped blocking regions.
Figure 5B:
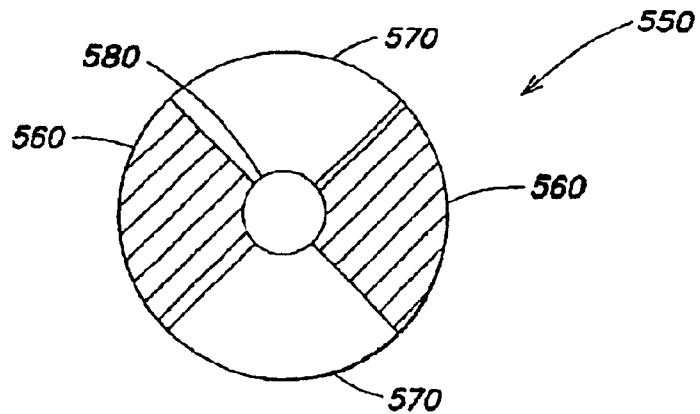
FIG. 5b is a top view of an embodiment of a pupil filter having truncated wedge shaped blocking regions.

FIGS. 5a and 5b are top views of alternative embodiments of pupil filters for use with systems such as system 300 of FIG. 3. FIG. 5a illustrates a pupil filter 500 having a pie-wedge shaped blocking regions 520 to block light (i.e., the mask has 0% transmission in regions 520) generally impinging on filter 500 along one of two perpendicular orientations. The pupil filter 500 also has pie-wedge shaped transmission regions 510 to transmit light generally impinging on filter 500 along the other of the two perpendicular orientations.

Pupil filter 500 is useful, for example, to pass diffracted light from a mask having a range of spatial frequencies along the x-direction and having a range of spatial frequencies along the y-direction. For example, by using pupil filter 500 in the manner described above with reference to FIGS. 3, 4a, and 4b, in the first step, all spatial frequencies along the x-direction are substantially passed and those along the y-direction are substantially blocked. In the second step, all spatial frequencies along the y-direction are substantially passed and those along the x-direction are substantially blocked.

FIG. 5b illustrates a pupil filter 550 having truncated pie-wedge shaped blocking regions 560, truncated pie-wedge shaped transmission regions 570, and a central blocking region 580 having reduced transmission, such as for example 50% transmission. For example, pupil filter 550 can be used in a manner similar to filter 500, with some differences in optical performance. The central unblocked region allows both the s- and p-polarized rays diffracted or transmitted by the mask to pass through the lens and to be used for quite conventional imaging, and since the rays near the pupil center are incident onto photosensitive layer 350 at angles fairly near normal incidence, both polarizations produce high contrast images. Because the blocked regions are exposed only once when the pupil filter is in either the first or the second position, while the unblocked center region is exposed both times, the 50% transmission in region 580 assures that the lower spatial frequencies passing through the pupil center do not receive enhanced exposure relative to the higher spatial frequencies in the image passing through the outer regions of the pupil. Using a transmission of more or less than 50% in the central unblocked region 580 could be used to enhance or reduce the effect of the lower spatial frequencies relative to the higher spatial frequencies to achieve better image quality for a specific application, as is known to those skilled in the art who use pupil filters. The most important function of the blocking regions is to block the p-polarized rays with angles of incidence within the photosensitive layer 350 at angles near 45 degrees (for normally incident illumination on the mask) that would produce little or no image contrast, degrading the resulting image.

In other embodiments, the pupil filter may be replaced by a shutter mechanism or other spatial selection device that selectively blocks light as described herein. The shutter mechanism may provide two or more light-blocking configurations that correspond to operation of the pupil filter described above.

While a two-step exposure scheme (i.e., using two polarizations and two pupil filter positions) is described above, optionally, more exposure steps may be used (i.e., using greater than two polarizations and two pupil filter positions). The additional polarizer and pupil filter positions are located at additional angular positions (e.g., intermediate the x-direction and the y-direction).

Figure 6:
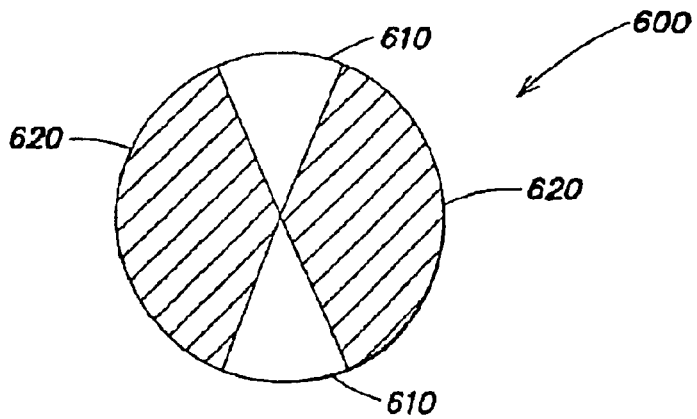
FIG. 6 is a top view of an embodiment of a pupil filter having wedge shaped blocking regions of greater than 90°.

FIG. 6 is a top view of a pupil filter 600 having pie-wedge shaped transmission regions 610 equal to one-eighth of the circular area of filter 600, and blocking regions 620 equal to three-eighths of the circular area of filter 600. Filter 600 is one example of a pupil filter that can be used with exposure schemes having greater than two steps (e.g., filter 600 may be used with an exposure scheme having four steps, where steps three and four are performed at two orientations normal to one another and intermediate the orientations aligned in the x-direction and the y-direction.) For example, such a scheme may be useful where features of a mask are oriented generally along the X-axis, the Y-axis, and other intermediate orientations.

Referring again to FIG. 3, an additional advantage of the invention is that it may allow the reduction of effects caused by crystallographically-dependent birefringence when crystalline optics (such as $CaF_2$) are used for lens system 330 of system 300. By selecting a polarization of light 322 to selectively excite substantially only the ordinary (or extraordinary) wave in the birefringent medium, and using pupil filter 334 to selectively block light in the manner described above with reference to FIGS. 3, 4a, and 4b, the deleterious effects of birefringence can be reduced. Additionally, substrate 351 may be translated on translation stage 352 to compensate for excitation of ordinary and extraordinary waves in successive stages of a given exposure scheme.

Figure 7:
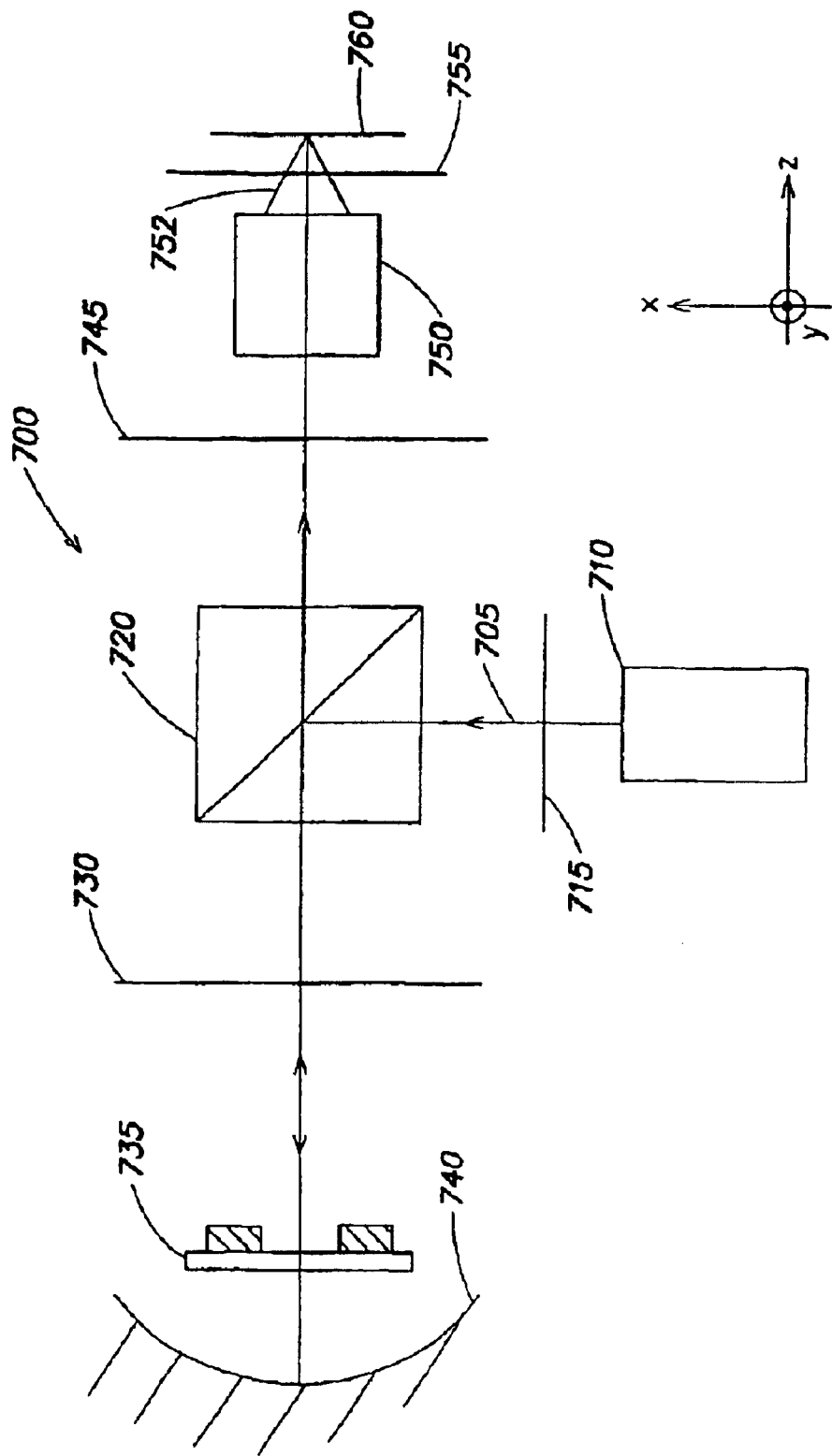
FIG. 7 is a schematic block diagram a lithographic system in accordance with an embodiment of the invention.

FIG. 7 is a schematic diagram of a lithographic system 700 according to an embodiment of the present invention. In system 700, light 705 passes from a source 710 through a polarizing prism 720 and is directed through a quarter-wave plate 730 and a pupil filter 735 to a converging mirror 740. Light 705 then passes through prism 720 a second time, to a mask 745 and a lens system 750. For light 705 to pass through prism 720 as described above, it is necessary that light 705 have the proper polarization both times it impinges on prism 720.

According to known principles, the polarization of light 705 is selected by polarizer 715 to allow prism 720 to redirect the light from source 710 toward mirror 740. The polarization of light 705 directed toward mirror 740 is altered, for example, by using birefringent quarter-wave plate 730. Although quarter-wave plate 730 is illustrated, any known method of altering polarization can be used to rotate the polarization of light 705. After reflection by mirror 740, the polarization is altered a second time by the quarter-wave plate 730 so that the light passes through polarizing prism 720 toward a surface 760.

Because light 705 must have a given polarization to traverse polarizing prism 720 in the above-described manner, the polarization upon exiting polarizing prism 720 toward surface 760 has a given polarization. However, to project two or more polarizations on to surface 760 in accordance with aspects of the present invention (e.g., s-polarized light for features of mask aligned in the x-direction, and s-polarized light for features of mask aligned in the y-direction), a birefringent half-wave plate 755 is placed between lens system 750 and photosensitive surface 760. By rotating half-wave plate 755, the polarization of light projected though it can be rotated by 90 degrees. Although half-wave plate 755 is illustrated between lens system 750 and surface 760, half-wave plate 755 can be located anywhere between prism 720 and surface 760. Preferably, half-wave plate 755 is located where the divergence angle of light is relatively small.

In a first pupil filter position, pupil filter 735 is selective of features of mask 745 aligned in a first direction, and half-wave plate 755 is oriented to project s-polarized light corresponding to the first direction onto surface 760. In a second pupil filter position, pupil filter 735 is selective of features of mask 745 aligned in a second direction and half-wave plate 755 is oriented to project s-polarized light corresponding to the second direction onto surface 760. For example, in a first step pupil filter 735 and half-wave plate 755 are coordinated to print features of mask 745 that are aligned in the x-direction using s-polarized light. In a second step, pupil filter 735 and half-wave plate 755 are coordinated to print features of mask 745 that are aligned in the y-direction using s-polarized light. After completing the printing of features aligned in the x-direction (i.e., step one), pupil filter 735 is rotated 90 degrees and half-wave plate is rotated 45 degrees to print features aligned in the y-direction (step two).

Having thus described the inventive concepts and a number of exemplary embodiments, it will be apparent to those skilled in the art that the invention may be implemented in various ways, and that modifications and improvements will readily occur to such persons. Thus, the examples given are not intended to be limiting, and are provided by way of example only. The invention is limited only as required by the following claims and equivalents thereto.

What is claimed is:

1. An imaging system comprising:
   a light source to generate light for illuminating an object having features aligned in a first direction and features aligned in a second direction;

a lens for imaging the illuminated object onto a surface;
a spatial selection device selective in a first mode of light corresponding to features of the illuminated object aligned in the first direction and selective in a second mode of light corresponding to features of the illuminated object aligned in the second direction, wherein the spatial selection device comprises a pupil filter and a rotation device for rotating the pupil filter with respect to an optical axis, wherein the rotation device is configured for rotating the pupil filter between first and second positions in the first and second modes, respectively, wherein the pupil filter includes one or more blocking regions and one or more non-blocking regions, and wherein the blocking regions comprise wedge-shaped blocking regions;
a polarization device optically coupled to the spatial selection device and selective in the first mode of s-polarized light corresponding to the first direction and selective in the second mode of s-polarized light corresponding to the second direction; and
a controller for selecting operation in the first mode or in the second mode.

2. An imaging system as defined in claim 1, wherein the wedge-shaped blocking regions have angles of about 90°.

3. An imaging system as defined in claim 1, wherein the wedge-shaped blocking regions have angles of greater than 90°.

4. An imaging system as defined in claim 1, wherein the blocking regions and the non-blocking regions are separated by 90°.

5. An imaging system as defined in claim 1, wherein the spatial selection device is positioned proximate a pupil of the lens.

6. An imaging system as defined in claim 1, wherein the light source is configured for illuminating a lithography mask.

7. An imaging system as defined in claim 1, configured as a lithographic system.

8. An imaging system as defined in claim 1, wherein the polarization device comprises a polarizer having an optical axis and a rotation device for rotating the polarizer about an optical axis.

9. An imaging system as defined in claim 8, wherein the rotation device is configured for rotating the polarizer between first and second positions in the first and second modes, respectively.

10. An imaging system as defined in claim 8, wherein the polarizer is located between the light source and the object.

11. An imaging system as defined in claim 1, wherein the polarization device comprises a polarizer, said imaging system further comprising a device for rotation of the pupil filter and the polarizer between respective first and second positions corresponding to the first and second modes, respectively.

12. An imaging system as defined in claim 11, wherein the first and second positions are separated by 90°.

13. An imaging system as defined in claim 1, wherein the spatial selection device and the polarization device are configured for equal intensity illumination of the surface in the first and second modes.

14. An imaging system comprising:
a light source to generate light for illuminating an object having features aligned in a first direction and features aligned in a second direction;
a lens for imaging the illuminated object onto a surface;
a spatial selection device selective in a first mode of light corresponding to features of the illuminated object aligned in the first direction and selective in a second mode of light corresponding to features of the illuminated object aligned in the second direction, wherein the spatial selection device comprises a pupil filter and a rotation device for rotating the pupil filter with respect to an optical axis, wherein the rotation device is configured for rotating the pupil filter between first and second positions in the first and second modes, respectively, wherein the pupil filter includes one or more blocking regions and one or more non-blocking regions, and wherein the blocking regions are bounded by an inner radius and an outer radius;
a polarization device optically coupled to the spatial selection device and selective in the first mode of s-polarized light corresponding to the first direction and selective in the second mode of s-polarized light corresponding to the second direction; and
a controller for selecting operation in the first mode or in the second mode.

15. An imagine system comprising:
a light source to generate light for illuminating an object having features aligned in a first direction and features aligned in a second direction;
a lens for imaging the illuminated object onto a surface;
a spatial selection device selective in a first mode of light corresponding to features of the illuminated object aligned in the first direction and selective in a second mode of light corresponding to features of the illuminated object aligned in the second direction, wherein the spatial selection device comprises a pupil filter and a rotation device for rotating the pupil filter with respect to an optical axis, wherein the rotation device is configured for rotating the pupil filter between first and second positions in the first and second modes, respectively, wherein the pupil filter includes one or more blocking regions and one or more non-blocking regions, and wherein the pupil filter further includes a region proximate the optical axis with partial transmission of light from the light source;
a polarization device optically coupled to the spatial selection device and selective in the first mode of s-polarized light corresponding to the first direction and selective in the second mode of s-polarized light corresponding to the second direction; and
a controller for selecting operation in the first mode or in the second mode.

16. An imaging system comprising:
a light source to generate light for illuminating an object having features aligned in a first direction and features aligned in a second direction;
a lens for imaging the illuminated object onto a surface;
a spatial selection device selective in a first mode of light corresponding to features of the illuminated object aligned in the first direction and selective in a second mode of light corresponding to features of the illuminated object aligned in the second direction;
a polarization device optically coupled to the spatial selection device and selective in the first mode of s-polarized light corresponding to the first direction and selective in the second mode of s-polarized light corresponding to the second direction, wherein the polarization device comprises a polarizer having an optical axis and a rotation device for rotating the polarizer about an optical axis and wherein the polarizer is located between the object and the surface, and a controller for selecting operation in the first mode or in the second mode.

17. An optical lithogaphic imaging system for projecting onto a surface a mask having features aligned in a first direction and features aligned in a second direction, comprising:

a pupil filter selective in a first position of light corresponding to features of the illuminated mask aligned in the first direction and selective in a second position of light corresponding to features of the illuminated mask aligned in the second direction, wherein the pupil filter includes one or more blocking regions and one or more non-blocking regions, and wherein the blocking regions comprise wedge-shaped blocking regions;

a polarizer optically coupled to the pupil filter and selective in the first position of s-polarized light corresponding to the first direction and selective in the second position of s-polarized light corresponding to the second direction; and a device configured for movement of the pupil filter and the polarizer between the respective first and second positions thereof.

18. An imaging method as defined in claim 17, wherein the polarizer comprises a birefringent half-wave plate.

19. An optical lithographic imaging system for projecting onto a surface a mask having features aligned in a first direction and features aligned in a second direction, comprising:

a pupil filter selective in a first position of light corresponding to features of the illuminated mask aligned in the first direction and selective in a second position of light corresponding to features of the illuminated mask aligned in the second direction, wherein the pupil filter includes one or more blocking regions and one or more non-blocking regions, and wherein the blocking regions are bounded by an inner radius and an outer radius;

a polarizer optically coupled to the pupil filter and selective in the first position of s-polarized light corresponding to the first direction and selective in the second position of s-polarized light corresponding to the second direction; and a device configured for movement of the pupil filter and the polarizer between the respective first and second positions thereof.

20. An optical lithographic imaging system for projecting onto a surface a mask having features aligned in a first direction and features aligned in a second direction, comprising:

a pupil filter selective in a first position of light corresponding to features of the illuminated mask aligned in the first direction and selective in a second position of light corresponding to features of the illuminated mask aligned in the second direction, wherein the pupil filter includes one or more blocking regions and one or more non-blocking regions, and wherein the pupil filter further includes a region proximate an optical axis with partial transmission of light;

a polarizer optically coupled to the pupil filter and selective in the first position of s-polarized light corresponding to the first direction and selective in the second position of s-polarized light corresponding to the second direction; and a device configured for movement of the pupil filter and the polarizer between the respective first and second positions thereof.

* * * * *

UNITED STATES PATENT AND TRADEMARK OFFICE
CERTIFICATE OF CORRECTION

PATENT NO.   : 6,965,484 B2 Page 1 of 1
DATED        : November 15, 2005
INVENTOR(S)  : David C. Shaver It is certified that error appears in the above-identified patent and that said Letters Patent is hereby corrected as shown below:

Column 12,
Line 20, "imagine" should be -- imaging --.

Signed and Sealed this

Fourteenth Day of March, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,965,484 B2 | Page 1 of 1 |
| APPLICATION NO. | : 10/626440 | |
| DATED | : November 15, 2005 | |
| INVENTOR(S) | : David C. Shaver | |

It is certified that error appears in the above-identified patent and that said Letters Patent is hereby corrected as shown below:

Please delete the paragraph titled 'STATEMENT OF GOVERNMENT SPONSORED R&D' encompassing Column 1, lines 14-16:

"This invention relates to optical imaging systems and methods and, more particularly, to optical lithography systems and methods"

and replace with:

--This invention was made with government support under Contract No. F19628-00-C-0002 awarded by the U.S. Air Force. The government has certain rights in this invention.--

Signed and Sealed this
Ninth Day of October, 2012

David J. Kappos
*Director of the United States Patent and Trademark Office*